US006301274B1

United States Patent
Tayebati et al.

(10) Patent No.: US 6,301,274 B1
(45) Date of Patent: Oct. 9, 2001

(54) TUNABLE EXTERNAL CAVITY LASER

(75) Inventors: Parviz Tayebati, Watertown; Daryoosh Vakhshoori, Cambridge, both of MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/281,404

(22) Filed: Mar. 30, 1999

Related U.S. Application Data

(60) Provisional application No. 60/079,995, filed on Mar. 30, 1998.

(51) Int. Cl.[7] ............................................. H01S 3/10
(52) U.S. Cl. ................................. 372/20; 372/98
(58) Field of Search ........................ 372/20, 92, 19, 372/32, 98; 356/352; 350/607; 359/291

(56) References Cited

U.S. PATENT DOCUMENTS

| 4,859,060 | * | 8/1989 | Katagiri et al. ........................ 356/352 |
| 5,022,745 | * | 6/1991 | Zayhowski et al. ................... 350/607 |
| 5,561,523 | * | 10/1996 | Blomberg et al. ..................... 356/352 |
| 5,629,951 | * | 5/1997 | Chang-Hasnian et al. ............. 37/20 |
| 5,771,253 | * | 6/1998 | Chang-Hasnian et al. ............ 372/20 |
| 6,108,321 | * | 8/2000 | Mansell et al. ....................... 359/291 |

* cited by examiner

Primary Examiner—Leon Scott, Jr.
(74) Attorney, Agent, or Firm—Pandiscio & Pandiscio

(57) ABSTRACT

A tunable microelectromechanical optical filter is placed in a linear laser cavity and is tilted at a large enough angle to prevent the unwanted reflections from coupling back to the mode of the cavity. Front and back mirrors form the cavity with a lens matching the mode of the gain media to that of the tuning element. The gain media can be a semiconductor, a solid state crystal or a fiber based region. In another preferred embodiment, the invention includes a ring cavity geometry with clockwise laser oscillation. In this case, the surface of the tunable microelectromechanical filter can be perpendicular to the direction of laser oscillation since the unwanted reflection may be prevented from coupling to the cavity mode by the action of an isolator.

4 Claims, 2 Drawing Sheets

TUNABLE EXTERNAL CAVITY LASER

REFERENCE TO EARLIER APPLICATION

This application claims the benefit of pending prior U.S. Provisional Patent Application Serial No. 60/079,995, filed Mar. 30, 1998, by Parviz Tayebati et al., and entitled TUNABLE EXTERNAL CAVITY LASER. The aforementioned document is hereby incorporated herein by reference.

FIELD OF THE INVENTION

The invention relates to lasers. More specifically, the invention relates to apparatuses for tuning the wavelength of a laser.

BACKGROUND OF THE INVENTION

Fiberoptic cables, having diameters measuring less than 0.00015 inch, can transmit multiple signals containing considerable quantities of information for hundreds of miles. The ability to carry multiple signals derives from the ability of the fiberoptic cable to "multiplex," or simultaneously transmit different light signals, each having a different wavelength. Multiplexed fiberoptic communication requires that the wavelength of the light sources introduced into the receiving end of the cable be adjustable to any wave length in the 1300 nm to 1600 nm range.

A typical laser light source includes a gain medium, or a semiconductor optical amplifier (SOA). One side of the SOA has an antireflection (AR) coating. The other side of the SOA is uncoated or has a high reflection coating. Light emitted from the AR-coated side is trained by one or more lenses onto a thin film filter, typically mounted on a substrate. The filter passes light in a range of wavelengths, thereby enabling a narrow linewidth or single mode laser emission. The filtered light is trained by another lens onto a curved mirror, or a lens and a flat mirror, which reflects the light back into the filter and the SOA. To ensure that out-of-band light does not return into the SOA, with undesirable consequences, the filter is positioned such that the angle of incidence with respect to the projection line of the light is not 90°, or orthogonal to the projection line. Out-of-band light is not passed through the filter, but reflected away from the SOA The wavelength of the laser emission is determined by the overlap between the transmission wavelength of the filter and the modes of the laser cavity.

In general, a problem encountered with typical film filters is the existence of temperature drifts, or gradients, in the film. Temperature drifts cause undesirable wavelength drifts and associated mode hopping and noise. An ideal laser light source for multiplexed communication must provide light with a stable wavelength.

To provide light at variable wavelengths, some light sources include a plurality of lasers, each emitting light at a different wavelength. However, normal wear and tear or the unavailability of a lasers at specific wavelengths can limit multiplexing potential.

Other light sources employ lasers with an angularly-adjustable filter. In such cases, rotating the filter changes the angle of incidence between the filter and a predetermined projection line, which in turn changes the transmission wavelength of the filter.

A major disadvantage of rotating angle-tunable lasers is that tuning the transmission of wavelength of the thin film filter necessarily is accompanied by an increase in optical path length in the underlying substrate. This can cause undesirable wavelength and intensity instabilities absent a high degree of controlling and stabilizing the rotation angle.

Still other light sources alter emission wavelength with a filter that has a variable Fabry-Perot gap thickness along its length. In these situations, translating the filter along a predetermined plane positions a portion of the filter having a different thickness in line with a predetermined projection line. The thickness difference correspondingly alters transmission wavelength.

A major disadvantage of the filter-translating tuning approach is that, once the filter is located, it must be maintained so that it does not drift into transitions zones between portions of the filter having continuous thickness, causing wavelength drift. The effect of filter drift on wavelength variation can be minimized by increasing the projected spot size of the laser beam at the filter. However, the filter must be long enough to cover the desired wavelength range. Furthermore, the cost of fabricating such filters, with large wavelength variation over a few millimeters distance, as is desired for compactness, is high.

The foregoing demonstrates a need for a singular, compact, tunable light source that emits light with variable, but stable, wavelengths and stable intensity that is thermally and mechanically insensitive.

SUMMARY OF THE INVENTION

The invention is a tunable external cavity laser which uses a microelectromechanical tunable filter such as that disclosed in co-pending U.S. patent application Ser. No. 09/105,399, filed Jun. 26, 1998, by Parviz Tayebati et al., for MICROELECTROMECHANICALLY TUNABLE, CONFOCAL, VERTICAL CAVITY SURFACE EMITTING LASER AND FABRY-PEROT FILTER, or co-pending U.S. patent application Ser. No. 09/059,877, filed Apr. 14, 1998 by Parviz Tayebati, for AN ELECTRICALLY TUNABLE FABRY-PEROT STRUCTURE UTILIZING A DEFORMABLE MULTI-LAYER MIRROR AND METHOD FOR MAKING THE SAME. The invention provides for emitting light with wavelength and intensity stability. In addition, the invention does not require inordinately precise positioning or maintenance. Further, a filter constructed according to the present invention is small, and is easily and accurately adjusted electromechanically to achieve desired wavelengths.

In one preferred embodiment of the invention, a tunable microelectromechanical optical filter is placed in a linear laser cavity and is tilted at a large enough angle to prevent the unwanted reflections from coupling back to the mode of the cavity. Front and back mirrors form the cavity with a lens matching the mode of the gain media to that of the tuning element. The gain media can be a semiconductor, a solid state crystal or a fiber based region. Further, the number of optical elements in the cavity may vary depending on the particularity of the microelectromechanical filter and cavity design. For example, in some situations, the back mirror may be replaced with a lens and a flat mirror. Other alternatives include the use of fiber or solid state gain media. In the fiber example, thermally expanded core fiber can be used instead of a lens to couple light into the filter. In the case of solid state gain media, the facet(s) of the crystal can be polished to form an integrated lens.

Another preferred embodiment of the invention includes a ring cavity geometry with clockwise laser oscillation. In this case, the surface of the tunable microelectromechanical filter can be perpendicular to the direction of laser oscillation since the unwanted reflection may be prevented from coupling to the cavity mode by the action of an isolator. Further, like the first method, the number of optical elements may be reduced or increased depending on the exact nature of gain media used and the dimension of the filter mode present. For example, if the beam size of the filter mode is large enough, the two lenses typically located on each side of the filter to match its mode with that of the cavity can be eliminated.

These and other features of the invention will be appreciated more readily in view of the drawings and detailed description below.

BRIEF DESCRIPTION OF THE DRAWINGS

The invention is described in detail below with reference to the following drawings, throughout which similar reference characters denote corresponding features consistently, and wherein.

DETAILED DESCRIPTION OF THE INVENTION

The invention is a tunable external cavity laser which utilizes a microelectromechanically tunable optical filter such as that shown, for example, in co-pending U.S. patent application Ser. No. 09/105,399, filed Jun. 26, 1998, by Parviz Tayebati et al., and entitled MICROELECTROMECHANICALLY TUNABLE, CONFOCAL, VERTICAL CAVITY SURFACE EMITTING LASER AND FABRY-PEROT FILTER, which document is hereby incorporated herein by reference.

However, it should be appreciated that the present invention might also utilize other microelectromechanically tunable optical filters, such as that shown, for example, in co-pending U.S. patent application Ser. No. 09/059,877, filed Apr. 14, 1998, by Parviz Tayebati, and entitled AN ELECTRICALLY TUNABLE FABRY-PEROT STRUCTURE UTILIZING A DEFORMABLE MULTI-LAYER MIRROR AND METHOD FOR MAKING THE SAME, which document is also hereby incorporated herein by reference.

Figure 1:
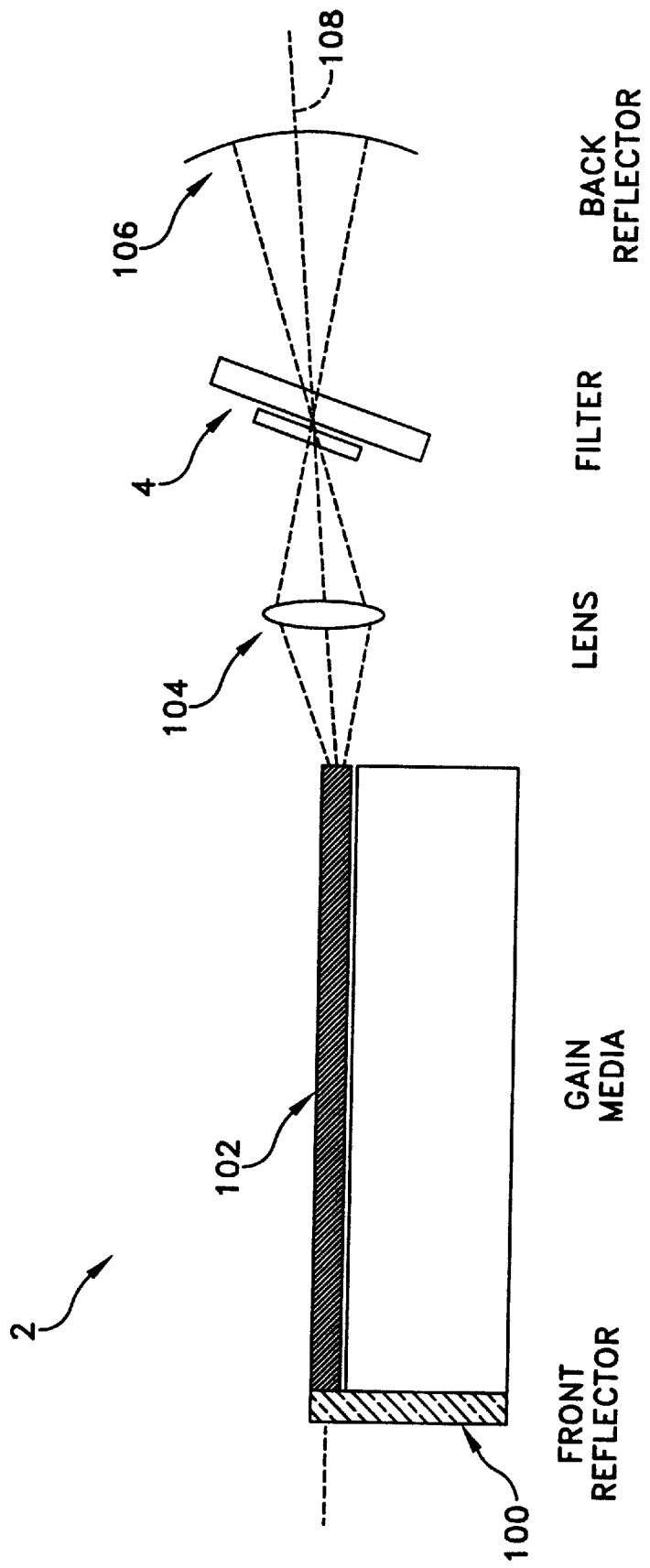
FIG. 1 is a schematic view of a linear laser cavity containing a tunable microelectromechanical filter.

Referring now to FIG. 1, one possible preferred embodiment of the invention is schematically shown. This embodiment constitutes a linear laser cavity 2 including a microelectromechanical optical filter 4 therein. More specifically, the invention includes, in a generally linearly aligned configuration, a front reflector 100, gain media 102, a lens 104, tunable microelectromechanical filter 4 and back reflector 106.

The microelectromechanical optical filter 4 is placed in the linear laser cavity 2, and is tilted at a large enough angle to the axis 108 extending between the front reflector 100 and the rear reflector 106 so as to prevent unwanted reflections from coupling back to the mode of the cavity 2.

The front and back reflectors 100 and 106 may be mirrors. They form the cavity 2 with the lens 104 matching the mode of the gain media 102 to that of the tuning element (filter 4).

The gain media 102 can be a semiconductor, a solid state crystal or a fiber based region. Further, the number of optical elements in the cavity 2 may vary depending on the particularity of the microelectromechanical optical filter 4 and cavity design.

For example, back mirror 106 might in an appropriate case be replaced with a lens and a flat mirror (not shown). Similarly, if gain media 102 is thermally expanded core fiber, it can be used instead of lens 104 to couple light into the filter 4. On the other hand, if the gain media 102 is solid state, the facet(s) of the crystal (not shown) can be polished to form an integrated lens.

It will therefore be seen that the use of a microelectromechanical optical filter 4 in laser cavity 2 is vastly superior to the filter-translation tuning approach mentioned above. In the present case, control of the electrical voltages applied to the substrate and to the respective DBR's of the filter controls the stress/strain relationships present between it's elements. Hence, the curvatures thereof and the internal spacing configuration of the filter are variably controllable (as explained in detail in U.S. patent application Ser. No. 09/105,399 incorporated herein by reference above). Therefore, the need for precise filter location, translational filter movement, wavelength drift and the other drawbacks of using non-tunable Fabry-Perot filters in the laser cavity are overcome. All that is required are means (not shown specifically) to control the applied voltages to the various parts of the filter 4 in order to create a fully tunable, comparatively inexpensive, laser.

Figure 2:
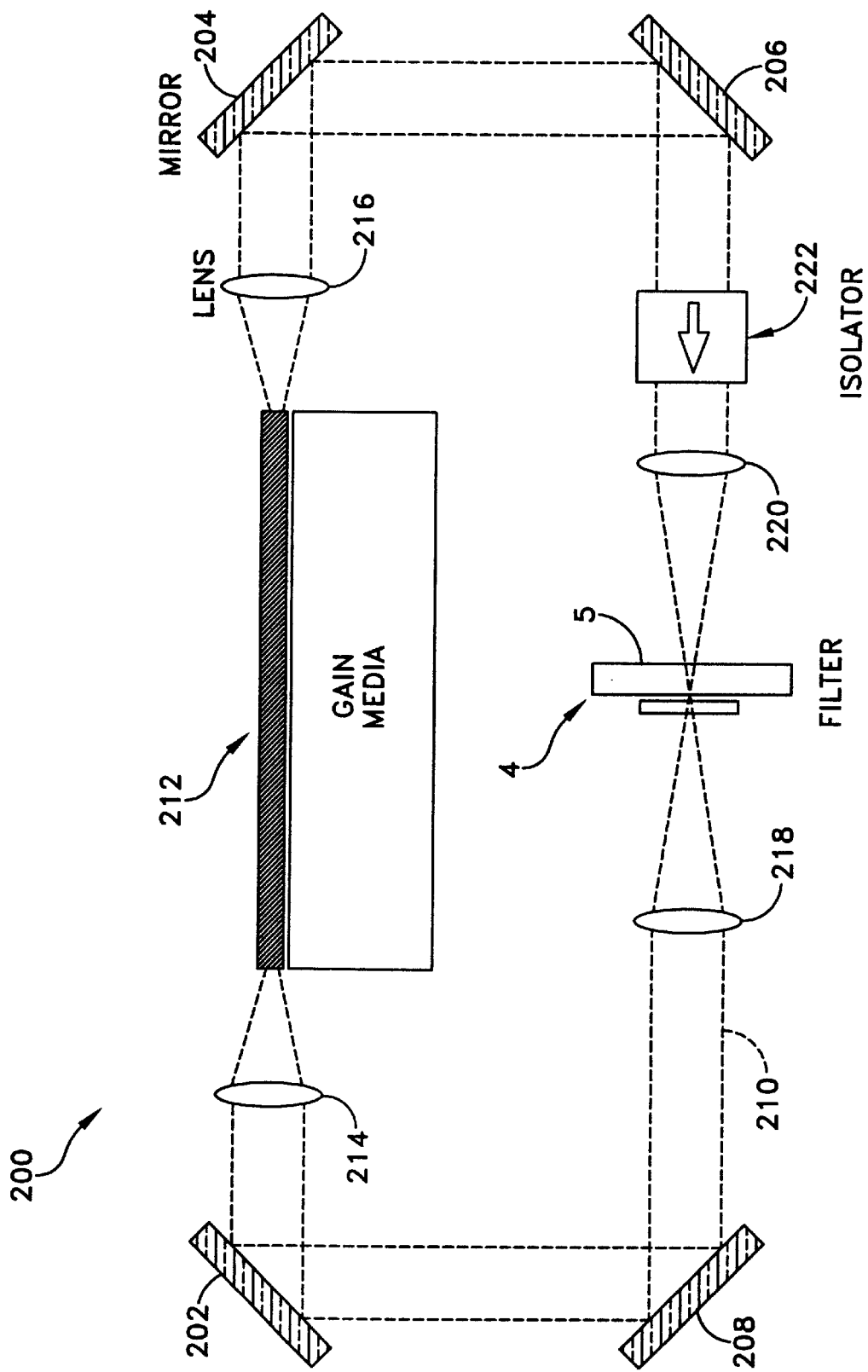
FIG. 2 is a schematic view of a ring cavity laser containing a tunable microelectromechanical filter.

FIG. 2 shows an alternative preferred embodiment of the present invention. In this embodiment, a ring cavity geometry 200 with clockwise laser oscillation is provided.

More particularly, the ring cavity 200 is generally rectangular in shape, with reflectors 202, 204, 206 and 208 located at its four corners so as to reflect light around the closed, generally rectangular path indicated generally by dotted lines 210. Gain media 212 is disposed between reflectors 202 and 204, and lenses 214 and 216 match the mode of the cavity to that of the gain media 212 and from the gain media 212 back into the cavity.

Ring cavity 200 also comprises the tunable microelectromechanical optical filter 4 discussed above with respect to FIG. 1. Filter 4 is located in path 210 between reflectors 206 and 208, with lenses 218 and 220 matching the mode of the cavity to that of filter 4. Further, isolator 222 prevents undesired reflected light from moving around the path 210 in a counterclockwise manner.

In this embodiment it will be understood that the surface 5 of the tunable optical microelectromechanical filter 4 can be perpendicular to the direction of laser oscillation, rather then being tilted as in FIG. 1. This is possible since the unwanted reflection is prevented from coupling to the cavity mode by the action of isolator 222.

Like the first method, the number of optical elements in path 210 can be reduced or increased depending on the exact nature of gain media 212 and the dimension of the filter mode. For example, if the beam size of the filter mode is large enough, the two lenses 218 and 220 at each side of the filter 4 might be eliminated without severe adverse consequences.

Further variations, modifications, alternations, changes and the like will occur to those skilled in the art in view of the above detailed description of two alternative preferred embodiments of the present invention. Therefore, it is to be understood that the scope of the present invention is defined and/or limited only by the terms of the claims.

What is claimed is:

1. A tunable laser comprising:

a first mirrored end;

a second mirrored end;

a cavity defined between said first and second mirrored ends;

a gain medium disposed in said cavity, said gain medium producing a light emission;

a microelectromechanically tunable filter disposed in said cavity between said gain medium and said second mirrored end, wherein a voltage applied across elements of said microelectromechanically tunable filter acts to tune said light emission within said cavity.

2. A laser according to claim 1 wherein said cavity defines a longitudinal axis, and further wherein said tunable filter is disposed at a given angle, said given angle being non-perpendicular to said longitudinal axis and said given angle being non-parallel to said longitudinal axis.

3. A laser according to claim 1 further comprising optical elements disposed in said cavity so as to condition said light emission moving through said cavity.

4. A tunable laser comprising:

a plurality of mirrored elements together defining a closed light path;

a gain medium disposed in said light path, said gain medium producing a light emission;

a microelectromechanically tunable filter disposed in said light path; and an optical isolator disposed between said gain medium and said filter for determining the direction of flow of said laser emission in said light path, wherein said optical isolator acts to prevent coupling of said light emission with unwanted reflected light from said microelectromechanically tunable filter.

* * * * *